United States Patent [19]

Levine

[11] 4,262,217

[45] Apr. 14, 1981

[54] CCD GAIN CONTROL

[75] Inventor: Peter A. Levine, Trenton, N.J.

[73] Assignee: RCA Corporation, New York, N.Y.

[21] Appl. No.: 122,724

[22] Filed: Feb. 19, 1980

Related U.S. Application Data

[63] Continuation of Ser. No. 821,100, Aug. 2, 1977, abandoned.

[51] Int. Cl.³ .................... G11C 19/28; H01L 29/78
[52] U.S. Cl. ................................ 307/221 D; 357/24
[58] Field of Search ................ 357/24; 307/221 D

[56] References Cited

U.S. PATENT DOCUMENTS

| | | | |
|---|---|---|---|
| 3,660,697 | 5/1972 | Berglund et al. | 357/24 |
| 3,858,232 | 12/1974 | Boyle et al. | 357/24 |
| 4,041,298 | 8/1977 | Lampe et al. | 357/24 |

OTHER PUBLICATIONS

Kosonocky et al, "Basic Concepts of Charge-Coupled Devices", RCA Review, vol. 36 (9/75) pp. 566-593.
Sequin et al, "Linearity of Electrical Charge Injection into Charge-Coupled Devices", IEEE J. Solid-State Circuits, vol. SC-10, (4/75) pp. 81-92.

Primary Examiner—Gene M. Munson
Attorney, Agent, or Firm—Samuel Cohen; George J. Seligsohn

[57] ABSTRACT

The present circuit is applicable to buried channel charge coupled devices (CCD's) of the type having an input circuit which employs a "skimming" technique for producing a charge representing an input signal. A given amount of charge initially is present in an input potential well of the CCD and an amount of charge representing an input signal is skimmed therefrom for propagation down the CCD, leaving behind a residual charge which continuously remains in the input potential well. The gain of the input circuit of the CCD is controlled by controlling the amount of this residual charge either in open loop fashion or by means of feedback. A comb filter suitable for separating the luminance and chrominance components of a television signal which includes this circuit is also described.

5 Claims, 8 Drawing Figures

CCD GAIN CONTROL

This is a continuation of application Ser. No. 821,100 filed Aug. 2, 1977, now abandoned.

The present invention relates to gain control circuits for charge coupled devices (CCD's) and to systems including such circuits.

Copending U.S. application Ser. No. 758,184 for "Linear CCD Input Circuit," filed Jan. 10, 1977 by J. E. Carnes, P. A. Levine (the present inventor), and D. J. Sauer and assigned to the same assignee as the present application, discusses a particular kind of input circuit for a buried channel CCD. This circuit colloquially is now referred to as a "fan and skim" input circuit. It is especially useful in CCD delay lines employed to delay analog signals such as the video signals of television as it permits linear signal translation.

Figure 1:
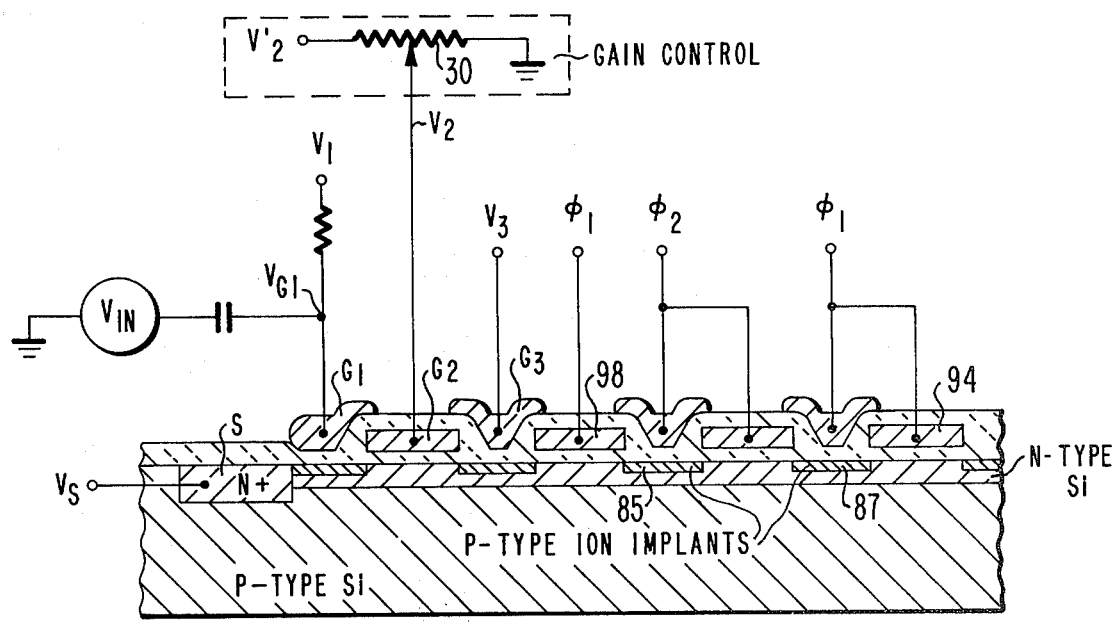
FIG. 1 is a section through a CCD embodying the invention.
Figure 2:
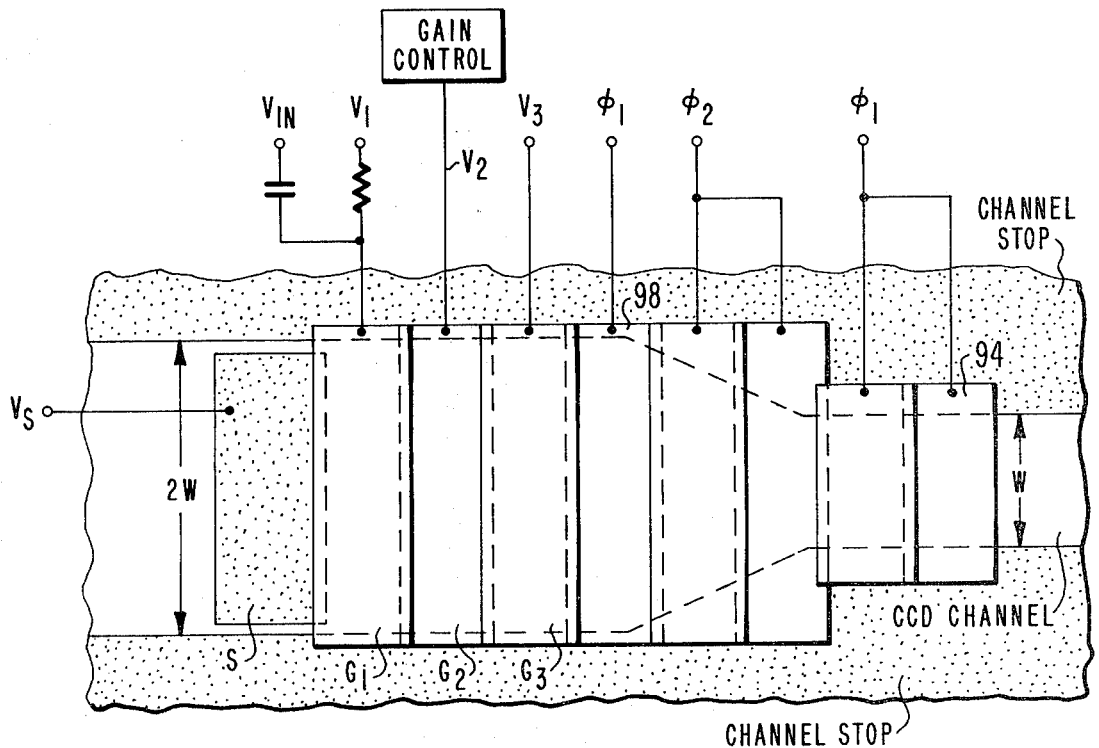
FIG. 2 is a plan view of the CCD of FIG. 1.

The CCD signal register shown in section in FIG. 1 and in plan view in FIG. 2, except for the gain control circuit, is similar to the CCD register described in the above-identified application. However, the present system, by way of example, utilizes self-aligned barrier implants such as 85 and 87 under the second layer of gate electrodes (rather than DC offsets between electrode pairs) to obtain asymmetrical potential wells in the substrate for permitting unidirectional charge propagation with two phase clocking. Typical processing parameters for a buried N-channel CCD with this structure are: (1) Substrate: P-type 30–50 Ω-cm resistivity; (2) N-type buried layers implant: Phosphorous, Dose = $1.3 \times 10^{12}$/cm², Energy = 150 keV, junction depth $X_j = 0.75$ micron; (3) P-type barrier implant: Boron, Dose = $4 \times 10^{11}$/cm², Energy = 100 keV.

As in the register of the copending application, the present CCD includes electrodes $G_1$, $G_2$ and $G_3$ and these are followed by multiple phase electrodes. The electrodes $G_1$, $G_2$ and $G_3$ are operated in such a way that a residual charge level $Q_F$ (FIG. 4) always remains stored in the potential well beneath electrode $G_2$. This residual change level places the operating point of the circuit at a desired point in the linear region of the input transfer characteristic of the CCD. Superimposed over this residual charge level $Q_F$ is an additional charge which may comprise a bias plus signal charge $Q_{(B+S)}$. This additional charge subsequently is "skimmed" from the potential well beneath electrode $G_2$ and transmitted down the CCD register. The CCD channel is relatively wide in the region of electrodes $G_1$, $G_2$ and $G_3$ and tapers down in width by an amount such that the maximum bias plus signal charge $Q_{(B+S)}$ will fill the first potential well in the narrowest channel region. In the example illustrated, the channel tapers from width 2W to width W.

Figure 3:
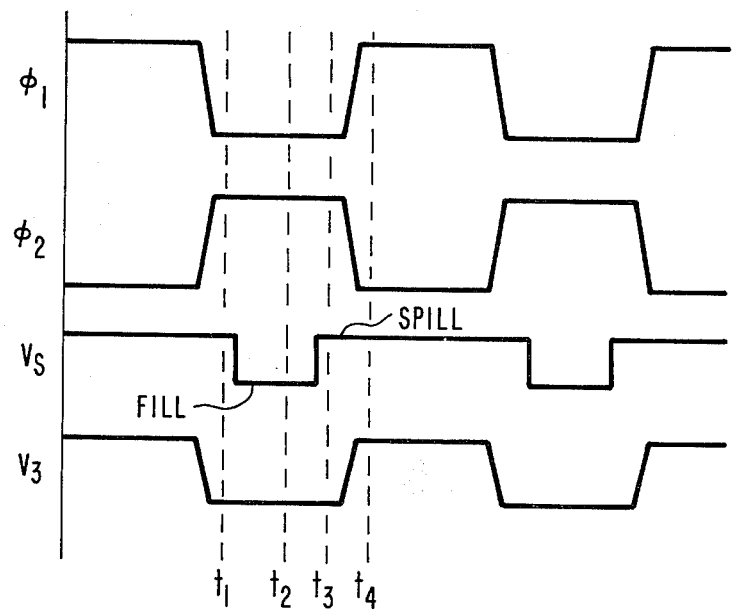
FIG. 3 is a drawing of waveforms employed for operating the CCD of FIGS. 1 and 2.
Figure 4:
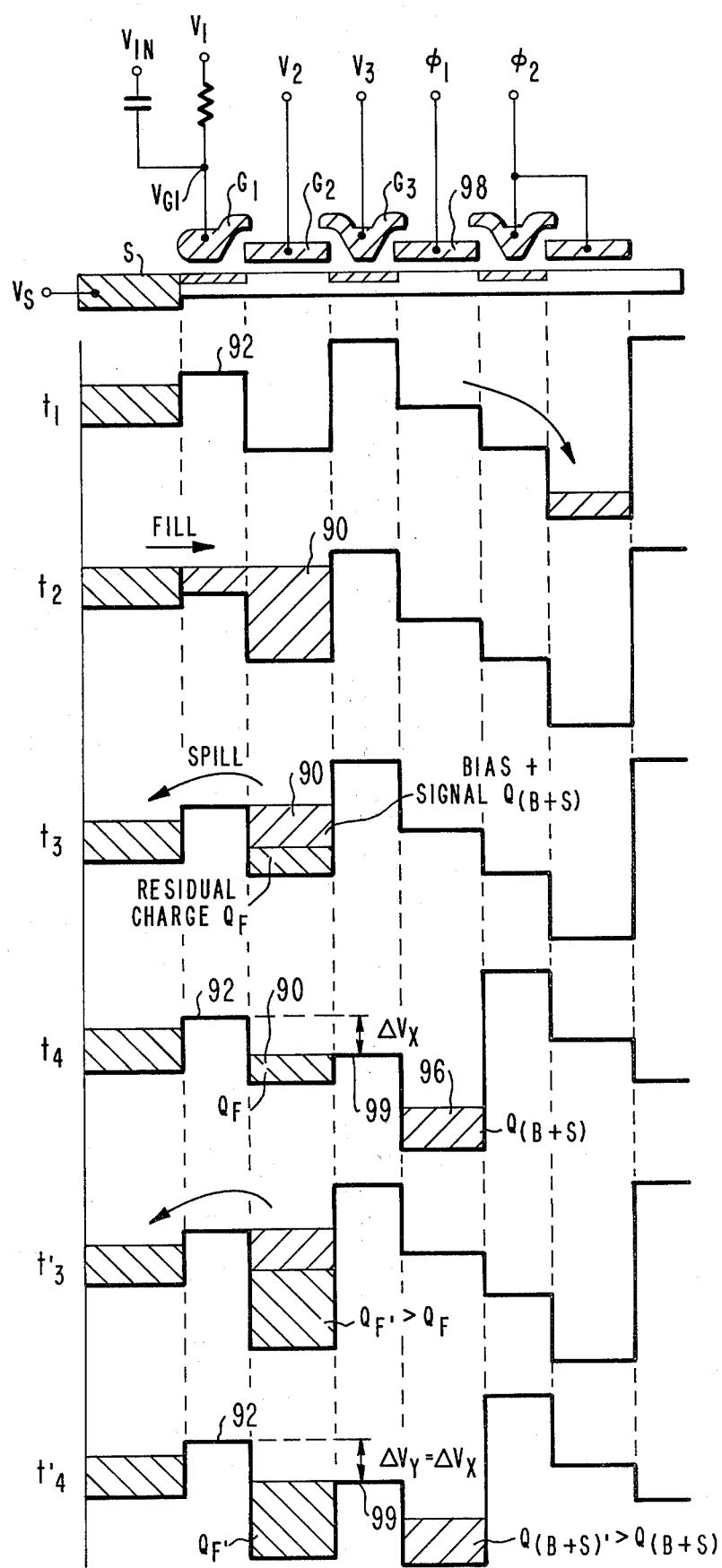
FIG. 4 is a drawing of substrate potential profiles to help explain the operation of the CCD of FIGS. 1 and 2.

The operation above is depicted in the substrate potential profiles of FIG. 4 when considered in connection with the operating waveforms of FIG. 3. At time $t_2$, the voltage $V_S$ applied to diffusion S causes this diffusion to operate as a source of charge carriers (electrons) and these flow into the potential well 90 beneath electrode $G_2$. At time $t_3$, the voltage $V_S$ is at a more positive level sufficiently so to cause the diffusion S to operate as a drain, and excess charge spills from the potential well 90 back into the diffusion S. There remains in potential well 90 a residual charge level $Q_F$ and a bias plus signal charge $Q_{(B+S)}$. This bias plus signal charge includes a direct voltage component whose value is dependent on the voltage $V_1$ applied to gate electrode $G_1$. That is, this bias component is dependent on the level of potential barrier 92 in the absence of input signal. In the case of a symmetrical input signal $V_{IN}$, the voltage $V_1$ will establish a potential barrier 92 such that the bias component of the charge $Q_{(B+S)}$ will be at the center of the linear region of the input characteristic. This may correspond, for example, to ½ the capacity of the potential well beneath electrode 94 in the main portion of the CCD channel, that is, the narrowed down portion of the CCD channel as shown in FIG. 2. For an asymmetrical input signal, the votage $V_1$ can be made to cause an operating point close to either end of the linear region of the input characteristic of the CCD, depending upon the direction of asymmetry of the input signal. In one limiting case, $V_1$ may be at a level such that $Q_B$ is zero. In another it may be at a level such that the input potential well is full in the absence of a signal $V_{IN}$.

At time $t_4$, when the voltage $V_3$ applied to the gate electrode $G_3$ is at its most positive value and when $\phi_1$ is also at its most positive value, the charge $Q_{(B+S)}$ has transferred from well 90 to the potential well 96 now present beneath the first phase 1 ($\phi_1$) electrode 98. In other words, this charge $Q_{(B+S)}$ has been skimmed from the potential well 90, leaving behind the residual charge level $Q_F$. The charge $Q_{(B+S)}$ subsequently is propagated down the CCD in conventional fashion.

In the operation of the system of the copending application identified above, the voltage $V_2$ applied to gate electrode $G_2$ is held at a fixed level so that the residual charge $Q_F$ also remains at a fixed level. The amount of charge propagated from potential well 90 (FIG. 4) to potential well 96, is a function of the difference in substrate potentials $\Delta V_X$ between substrate potentials at 92 and 99. These, in turn, are a function of the difference in potential $V_{G1} - V_3$ applied to gate electrodes $G_1$ and $G_3$, respectively, where $V_{G1}$ includes both the DC and AC components applied to gate electrode $G_1$.

The present invention resides, in part, in the discovery that the gain of the input circuit to the CCD is a function of the voltage $V_2$ applied to gate electrode $G_2$, that is, it is a function of the residual charge level $Q_F$. The present inventor has found that for a given $\Delta V_X$, if $V_2$ is made more positive, that is, if the size of the residual charge packet $Q_F$ is increased, the gain of the input circuit is increased and vice-versa. This is illustrated in FIG. 4 by the last three substrate potential profiles. At time $t_4$, the voltage $V_2$ is at a level such that a residual charge level $Q_F$ remains in potential well 90 for a given difference in potential $\Delta V_X$ between surface potentials 92 and 99. The transferred charge is $Q_{(B+S)}$ which subsequently is propagated down the CCD. If $V_2$ is increased while the difference between surface potentials 92 and 99 remains the same, the amount of transferred charge $Q_{(B+S)}'$ increases. This is illustrated by the potential profiles at time $t_3'$ and $t_4'$. In the former, which illustrates the spill portion of the cycle corresponding to $t_3$, $V_2$ has been made more positive so that the residual charge component $Q_F'$ has been increased, that is, $Q_F' > Q_F$. At time $t_4'$ corresponding to time $t_4$, the difference $\Delta V_X$ between substrate potentials 92 and 99 is equal to $V_Y$; however, the amount of charge transferred $Q_{(B+S)}'$ is greater than $Q_{(B+S)}$.

Figure 5:
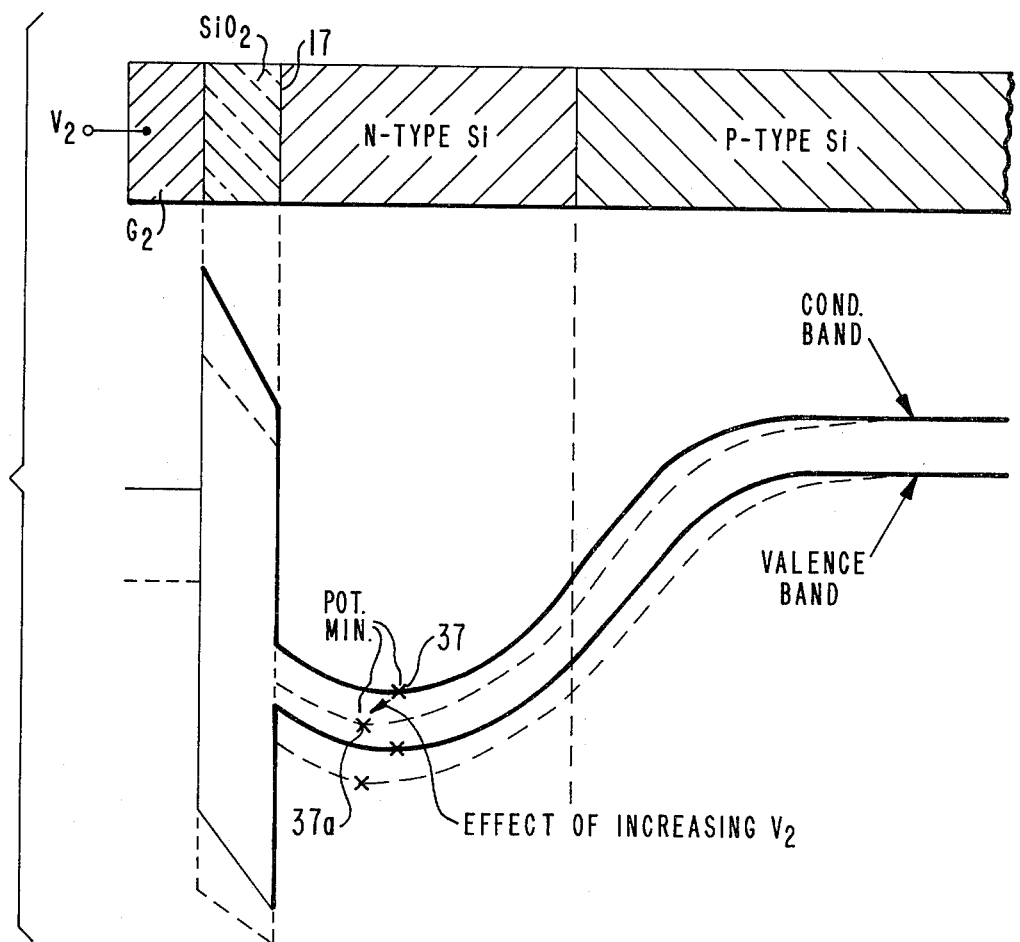
FIG. 5 is a drawing of the electron energy bands of a CCD embodying the invention.

The reason for the above is not completely understood. However, the following model may provide a basis for an explanation. It is believed that as the voltage $V_2$ applied to the gate electrode $G_2$ is increased, the depth of the potential minimum of the conduction band increases and the potential valley in the conduction band moves toward the surface 17 of the N-type silicon layer as illustrated in the energy band diagram of FIG. 5. The solid line illustrates the substrate potentials for a lower value of $V_2$ and the dashed line the shift which occurs when the voltage $V_2$ is increased in a sense to increase the residual charge level $Q_F$. Note the shift in the potential minimum from 37 to 37a, 37a being closer to surface 17. This change in the position of the potential minimum is believed to be manifested as an effective increase in the capacitance C of the CCD channel, and as the charge signal amplitude $Q_{SIG}$ is a function of this capacitance C, this increase $Q_{SIG}$. The equation relating these quantities is:

$$Q_{SIG} = \Delta(V_c - V_{G1})C$$

Figure 6:
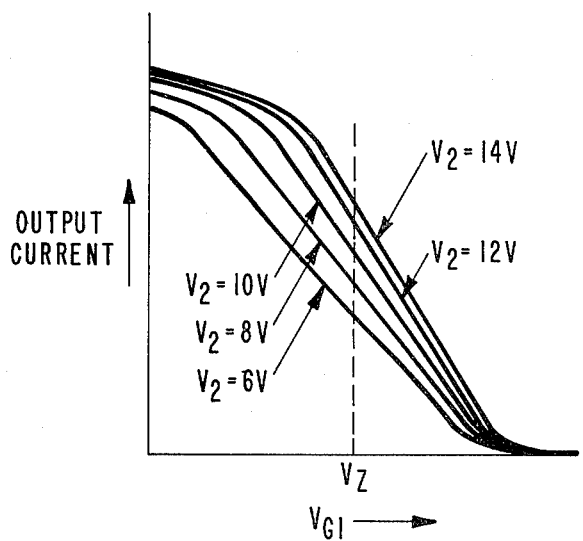
FIG. 6 is a family of graphs to help explain the operation of the CCD of FIGS. 1 and 2.

The family of curves of FIG. 6 illustrates the operation of the present gain control circuit. Each curve was obtained by applying a linear ramp $V_{G1}$ to a gate electrode corresponding to $G_1$ while maintaining fixed the voltage $V_3$ applied to a gate electrode corresponding to $G_3$. Each curve is for a different voltage level $V_2$ applied to an electrode corresponding to $G_2$. The ordinate of the curves is output current. It was measured by sensing the current produced in the output circuit (a drain diffusion, not shown) of the CCD in response to the applied voltages. Note that at any particular value of voltage $V_{G1}$, such as $V_Z$, the input gain (slope) obtained is higher at higher values of $V_2$ than at lower values of $V_2$ (except, of course, where the curves converge at the zero output current crossing of the $V_{G1}$ axis).

Figure 7:
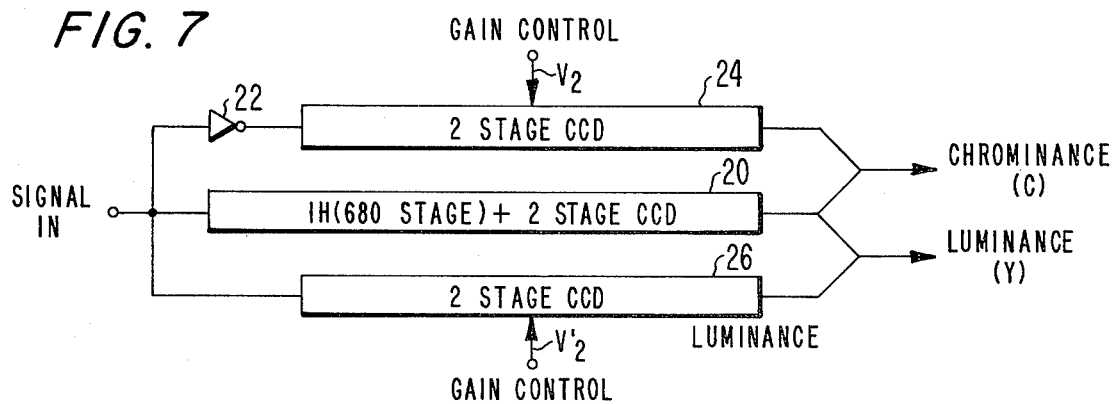
FIG. 7 is a schematic showing of a system embodying the invention.

FIG. 7 illustrates an important use of the gain control circuit of the present application. This figure shows schematically, a comb filter which may be employed for commercial television. Details of this filter are given in copending application Ser. No. 781,303 for "Electronic Signal Processing Apparatus" filed March 25, 1977 by Dalton H. Pritchard and assigned to the same assignee as the present application. In brief, it includes a 1H (1 horizontal line period) plus N CCD stage delay line 20 in one branch, an inverter 22 and a N-stage CCD delay line 24 in a second branch and a N-stage CCD delay line 26 in a third branch. In this particular example, N is assumed to be 2. Each 2-stage delay line has an input circuit such as shown in FIG. 1. The video signal is capacitively coupled to gate electrode $G_1$ of lines 20 and 26 and the inverted video signal is capacitively coupled to gate electrode $G_1$ of line 24. One gain control voltage ($V_2$) is applied to gate $G_2$ of line 24 and another gain control voltage (call it $V_2'$) is applied to gate $G_2$ of line 26. The long delay line 20 also has an input circuit such as shown in FIG. 1; however the voltage $V_2$ supplied to its gate electrode need not be made controllable but can be left at a fixed level. The output signal of the long delay line 20 is combined with that of the short (two-stage) delay line 26 to produce the luminance signal, and the output signal of the long delay line 20 is combined with the output signal of the short (two-stage) delay line 24 to produce the chrominance signal. It is necessary to adjust the relative gains of the short delay lines 24 and 26 to obtain rejection notches of sufficient depth at the color subcarrier frequency 3.58 MHz (megahertz). The gain control circuit of the present application employed in each short delay line 24 and 26 provides sufficient range to make this adjustment.

The present gain control is a significant improvement over a previous approach known to the present inventor for controlling the respective gains of the chrominance and luminance channels which required considerable on-chip transistor circuitry to balance the signals in these channels. With the present circuit it has been found possible to achieve gain variation of about ±20%, for a voltage range of 6–14 volts applied to electrode $G_2$. The means for producing a voltage in this range may simply be a potentiometer such as illustrated at 30 in FIG. 1 or may be a feedback circuit for automatically controlling the gain of electrode $G_2$. This gain variation is more than adequate for the balance control just described for the comb filter of FIG. 7.

Figure 8:
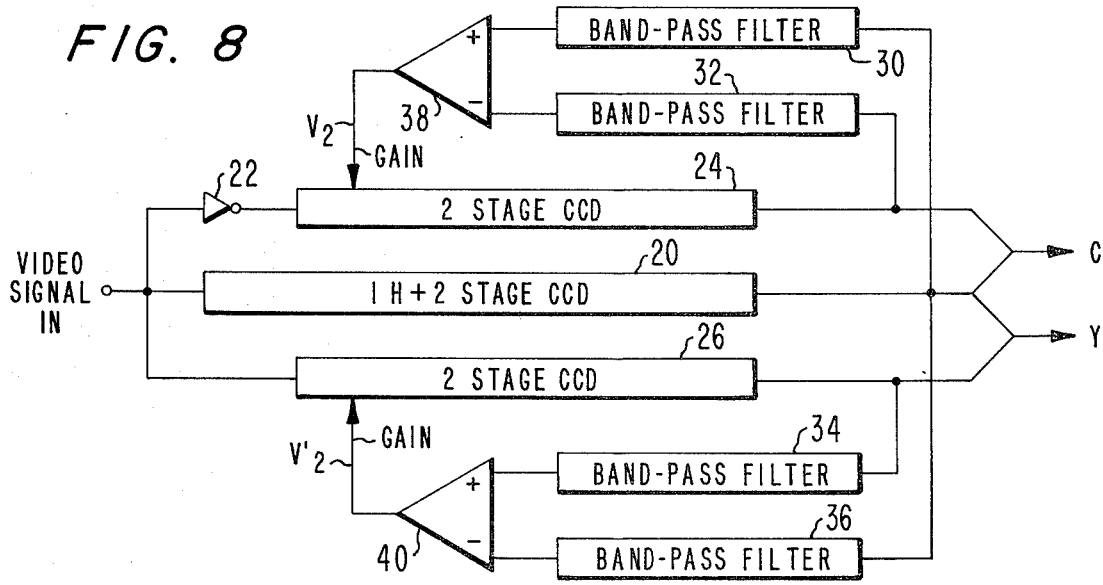
FIG. 8 is a schematic showing of a system including a feedback controlled embodiment of the invention.

FIG. 8 illustrates a comb filter such as shown in FIG. 7 but with automatic control of the gains of the short delay lines 24 and 26 by negative feedback circuits. The long and short delay lines have the same structure as described in connection with FIG. 7. The circuit includes, in addition, four band pass filters 30, 32, 34 and 36 and two differential amplifiers 38 and 40. The band pass filters are all tuned to the same particular frequency at or close to the center frequency 3.58 MHz of the color subcarrier components of the signals being passed through these lines.

In operation, the output signal of short delay line 24 is supplied through filter 32 to the inverting terminal of differential amplifier 38 and the output of the long delay line 20 is supplied through band pass filter 30 to the non-inverting terminal of the differential amplifier 38. In complementary fashion, the output of short delay line 26 is supplied through band pass filter 34 to the non-inverting terminal of differential amplifier 40 and the output of the long delay line 20 is applied through filter 36 to the inverting terminal of differential amplifier 40. The differential amplifiers compare the signals they receive and adjust the gain of the short delay lines to control the output signal amplitude of these delay lines at the particular frequency to which the band pass filters are tuned which as already mentioned, is at or close to the color subcarrier frequency of 3.58 MHz. The control is in a sense to make the gain of the short delay lines equal to that of the long delay lines at this frequency. The result of operating in this way is to automatically control the depth of the rejection notches produced by the comb filter to their minimum levels.

While the present invention has been illustrated as embodied in a two-phase CCD, it is to be understood that it is equally applicable to CCD's operated by any practical number of phases. Further, while two layer electrodes are shown, the invention is applicable also to single layer, triple layer and other well-known CCD structures. With respect to two-phase structures, means other than the ion implants illustrated may be employed for providing asymmetrical potential wells. Further, while in the illustrated system the substrate is of P-type and the surface layer of N-type, the reverse may be the case with corresponding change in operating voltage polarity. Finally, it is to be understood that the present invention is also applicable to other (than "fill and spill") forms of buried channel CCD's which employ a residual charge which continually is present in an input potential well.

What is claimed is:

1. In a buried channel charge-coupled device (CCD) of the type having a substrate of one conductivity type, a surface layer of different conductivity type, a source of charge carriers in the substrate, a charge storage region in the substrate whose potential is controlled by an overlying electrode, receptive of a charge from said source of charge carriers, and means for transferring from said storage region to a transfer site in said substrate an amount $Q_S$ of charge signal which is dependent on the amplitude $V_{IN}$ of an input signal and for leaving behind in said storage region a residual charge at a given level $Q_F$ independent of the input signal amplitude; a method for setting the transfer function $\Delta Q_S/\Delta V_{IN}$ of said CCD at substantially a preselected value, said method comprising the steps of:

(a) varying the level of the voltage applied to said electrode within a range of levels to thereby adjust the level $Q_F$ of said residual charge and hence determine the value of said transfer function in accordance with said electrode voltage level, said range of levels including that particular electrode voltage level at which said transfer function has said preselected value, and (b) terminating the variation of said electrode voltage level in response to said transfer function reaching substantially said preselected value.

2. The method defined in claim 1, wherein step a) comprises;

manually varying the level of the voltage applied to said electrode within said range of levels.

3. The method as defined in claim 2, wherein step a) comprises:

automatically varying the voltage applied to said electrode within said range of levels in accordance with a negative feedback signal.

4. In a buried channel charge-coupled device (CCD) of the type having a substrate of one conductivity type, a surface layer of different conductivity type, a source of charge carriers in the substrate, a charge storage region in the substrate whose potential is controlled by an overlying electrode, receptive of a charge from said source of charge carriers, means for transferring from said storage region to a transfer site in said substrate an amount $Q_S$ of charge signal which is dependent on the amplitude $V_{IN}$ of an input signal and for leaving behind in said storage region a residual charge at a given level independent of the input signal amplitude, an output circuit for producing an output signal, and means for shifting charge from said transfer site to said output circuit, the improvement comprising means for controlling the transfer function $\Delta Q_S/\Delta V_{IN}$ of said CCD comprising means for producing a second signal, and a feedback circuit responsive to said output signal and to said second signal for supplying a voltage to said electrode for controlling the level of said residual charge.

5. In combination:

a buried channel first charge-coupled device (CCD) of the type having a substrate of one conductivity type, a surface layer of different conductivity type, a source of charge carriers in the substrate, a charge storage region in the substrate whose potential is controlled by an overlying electrode, receptive of a charge from said source of charge carriers, means for transferring from said storage region to a transfer site in said substrate an amount $Q_S$ of charge signal which is dependent on the amplitude $V_{IN}$ of an input signal and for leaving behind in said storage region a residual charge at a given level independent of the input signal amplitude, an output circuit receptive of charge for producing an output signal, and electrode means coupled to said substrate and responsive to applied voltages for propagating charge from said transfer site to said output circuit;

a buried channel second CCD, having a substrate of one conductivity type, a surface layer of different conductivity type, input circuit means responsive to said input signal $V_{IN}$ for producing an amount $Q_S$ of charge signal in said substrate which is dependent on the amplitude $V_{IN}$ of said input signal, an output circuit receptive of charge for producing an output signal, and electrode means coupled to said substrate of said second CCD and responsive to applied voltages for propagating charge from said transfer site of said second CCD to said output circuit of said second CCD; and a feedback circuit coupled to the output circuit of each CCD, said feedback circuit including a comparator for comparing the output signal level in a particular frequency band at the output of one CCD with the output signal level in the same frequency band at the output of the other CCD, and a feedback connection from the output of said comparator to said electrode of said first CCD, for applying a voltage to said electrode of a sense to make the signals supplied to said comparator by said CCD's equal in value.

* * * * *